(12) United States Patent
Huang

(10) Patent No.: US 11,328,989 B2
(45) Date of Patent: May 10, 2022

(54) WIRING STRUCTURE AND METHOD FOR MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 14 days.

(21) Appl. No.: 16/821,838

(22) Filed: Mar. 17, 2020

(65) Prior Publication Data
US 2021/0296230 A1 Sep. 23, 2021

(51) Int. Cl.
| | |
|---|---|
| *H01L 23/522* | (2006.01) |
| *H01L 23/528* | (2006.01) |
| *H01L 21/768* | (2006.01) |
| *H01L 25/075* | (2006.01) |

(52) U.S. Cl.
CPC .... *H01L 23/5226* (2013.01); *H01L 21/76802* (2013.01); *H01L 23/528* (2013.01); *H01L 23/5283* (2013.01); *H01L 25/0753* (2013.01)

(58) Field of Classification Search
CPC ........... H01L 23/5226; H01L 21/76802; H01L 23/528; H01L 23/5283; H01L 25/0753
See application file for complete search history.

(56) References Cited

U.S. PATENT DOCUMENTS

| | | | |
|---|---|---|---|
| 10,306,777 B2 | 5/2019 | Lin et al. | |
| 2017/0084591 A1* | 3/2017 | Magnus | ............ H01L 23/49838 |
| 2019/0139949 A1* | 5/2019 | Liu | ...................... H01L 25/0753 |
| 2020/0105694 A1* | 4/2020 | Ko | ........................ H05K 3/3452 |

* cited by examiner

*Primary Examiner* — Patricia D Valenzuela
(74) *Attorney, Agent, or Firm* — Foley & Lardner LLP

(57) ABSTRACT

A wiring structure and a method for manufacturing the same are provided. The wiring structure includes an upper conductive structure, a lower conductive structure and a redistribution structure. The upper conductive structure includes at least one dielectric layer and at least one circuit layer in contact with the dielectric layer. The lower conductive structure includes at least one dielectric layer and at least one circuit layer in contact with the dielectric layer. The redistribution structure is disposed between the upper conductive structure and the lower conductive structure to electrically connect the upper conductive structure and the lower conductive structure. The redistribution structure includes a dielectric structure and a redistribution layer embedded in the dielectric structure. The redistribution layer includes at least one circuit layer. A line width of the circuit layer of the redistribution layer is less than a line width of the circuit layer of the upper conductive structure and a line width of the circuit layer of the lower conductive structure.

20 Claims, 14 Drawing Sheets

WIRING STRUCTURE AND METHOD FOR MANUFACTURING THE SAME

BACKGROUND

1. Field of the Disclosure

The present disclosure relates to a wiring structure and a manufacturing method, and to a wiring structure including a redistribution structure disposed between two conductive structures, and a method for manufacturing the wiring structure.

2. Description of the Related Art

As for a high-end product such as a flip chip ball grid array (FCBGA) package for 5G high-speed transmission, a multi-layer substrate may be required to transmit high-speed signals. However, when a number of layers of the multi-layer substrate is significantly increased, yield of the multi-layer substrate may correspondingly decrease, and thickness of the multi-layer substrate may increase.

SUMMARY

In some embodiments, a wiring structure includes an upper conductive structure, a lower conductive structure and a redistribution structure. The upper conductive structure includes at least one dielectric layer and at least one circuit layer in contact with the dielectric layer. The lower conductive structure includes at least one dielectric layer and at least one circuit layer in contact with the dielectric layer. The redistribution structure is disposed between the upper conductive structure and the lower conductive structure to electrically connect the upper conductive structure and the lower conductive structure. The redistribution structure includes a dielectric structure and a redistribution layer embedded in the dielectric structure. The redistribution layer includes at least one circuit layer. A line width of the circuit layer of the redistribution layer is less than a line width of the circuit layer of the upper conductive structure and a line width of the circuit layer of the lower conductive structure.

In some embodiments, a wiring structure includes an upper conductive structure, a lower conductive structure and a redistribution structure. The upper conductive structure includes at least one dielectric layer and at least one circuit layer in contact with the dielectric layer. The lower conductive structure includes at least one dielectric layer and at least one circuit layer in contact with the dielectric layer. The redistribution structure is disposed between the upper conductive structure and the lower conductive structure to electrically connect the upper conductive structure and the lower conductive structure. The redistribution structure includes a dielectric structure and a redistribution layer embedded in the dielectric structure. The redistribution layer includes a topmost circuit layer, a bottommost circuit layer and at least one intermediate circuit layer between the topmost circuit layer and the bottommost circuit layer. A thickness of the intermediate circuit layer is less than a thickness of the topmost circuit layer and a thickness of the bottommost circuit layer.

In some embodiments, a method for manufacturing a wiring structure includes: (a) providing a redistribution structure having an upper surface and a lower surface opposite to the upper surface; and (b) forming an upper conductive structure on the upper surface of the redistribution structure and forming a lower conductive structure on the lower surface of the redistribution structure, and electrically connecting the upper conductive structure and the redistribution structure through at least one upper conductive via and electrically connecting the lower conductive structure and the redistribution structure through at least one lower conductive via.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
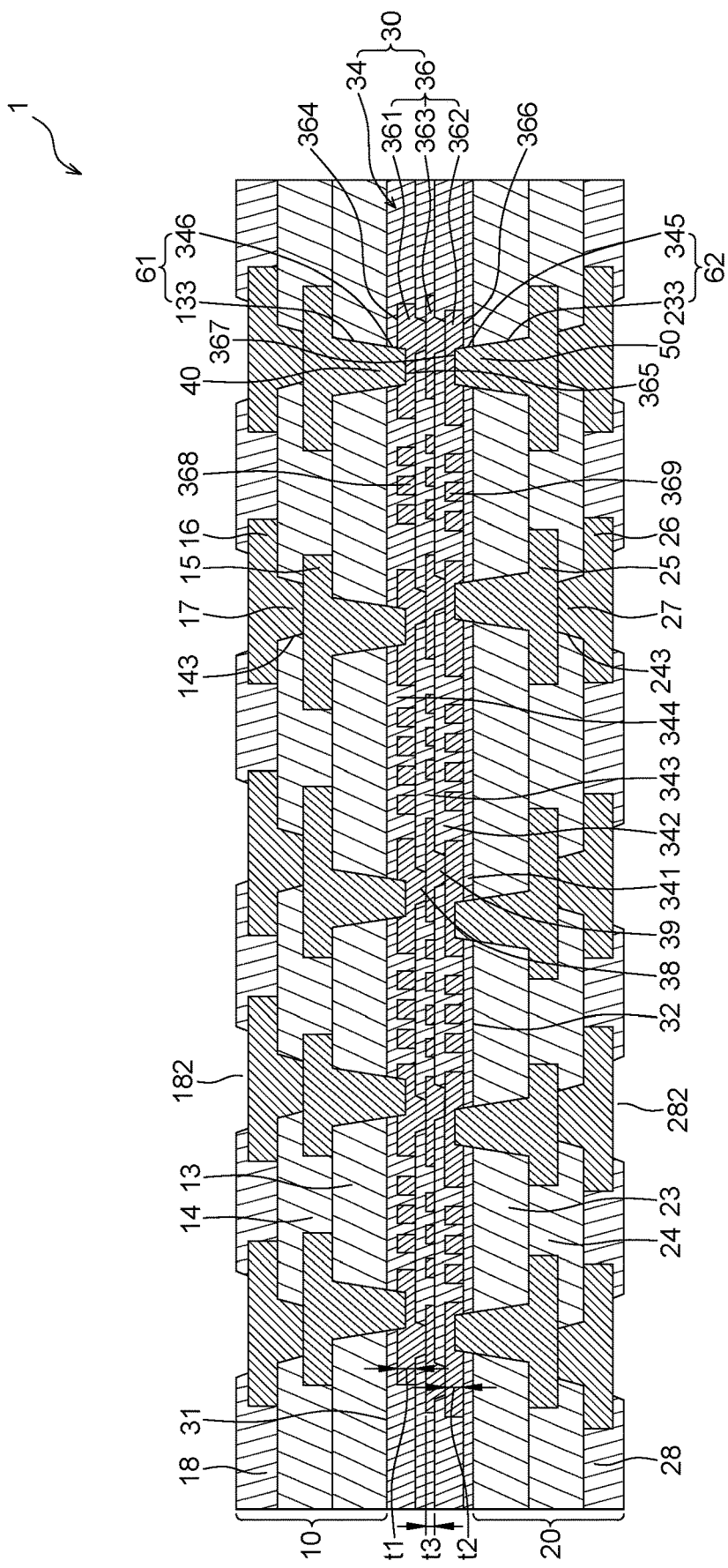
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a wiring structure which has improved yield and reduced thickness. In some embodiments, the wiring structure includes a redistribution structure disposed between an upper conductive structure and a lower conductive structure to electrically connect the upper conductive structure and the lower conductive structure. At least some embodiments of the present disclosure further provide for techniques for manufacturing the wiring structure.

FIG. 1 illustrates a cross-sectional view of a wiring structure 1 according to some embodiments of the present disclosure. The wiring structure 1 includes an upper conductive structure 10, a lower conductive structure 20, a redistribution structure 30, at least one upper conductive via 40 and at least one lower conductive via 50.

The upper conductive structure 10 includes at least one dielectric layer (including, for example, a first dielectric layer 13 and a second dielectric layer 14), at least one circuit layer (including, for example, a first circuit layer 15 and a second circuit layer 16) in contact with the dielectric layer (e.g., the first dielectric layer 13 and the second dielectric layer 14), at least one inner via 17 and a protection layer 18. In some embodiments, the upper conductive structure 10 may be a low-density conductive structure or a substrate level conductive structure. That is, a line width/line space (L/S) of the circuit layer (e.g., the first circuit layer 15 and the second circuit layer 16) of the upper conductive structure 10 may be greater than or equal to about 10 μm/10 μm.

In some embodiments, the upper conductive structure 10 may include a plurality of dielectric layers (for example, a first dielectric layer 13 and a second dielectric layer 14) and a plurality of circuit layers (for example, a first circuit layer 15 and a second circuit layer 16). The dielectric layers (e.g., the first dielectric layer 13 and the second dielectric layer 14) are stacked to each other. For example, the second dielectric layer 14 is disposed on a top surface of the first dielectric layer 13, thus, the second dielectric layer 14 is the topmost dielectric layer. Materials of the dielectric layers (e.g., the first dielectric layer 13 and the second dielectric layer 14) may be, for example, polypropylene (PP) or ajinomoto build-up film (ABF). In some embodiments, a plurality of fibers (e.g., glass fibers) may be embedded in the dielectric layers (e.g., the first dielectric layer 13 and the second dielectric layer 14) to improve the material strength of the dielectric layers (e.g., the first dielectric layer 13 and the second dielectric layer 14).

In addition, the first dielectric layer 13 may define at least one through hole 133 extending the first dielectric layer 13. As shown in FIG. 1, the through hole 133 of the first dielectric layer 13 tapers downward, that is, a size of a top portion of the through hole 133 is greater than a size of a bottom portion of the through hole 133.

In some embodiments, the circuit layers (e.g., the first circuit layer 15 and the second circuit layer 16) may be coarse line width/line space circuit layers. That is, a line width/line space of the circuit layers (e.g., the first circuit layer 15 and the second circuit layer 16) may be greater than or equal to about 10 μm/10 μm, or greater than or equal to about 15 μm/15 μm. The first circuit layer 15 is disposed on a top surface of the first dielectric layer 13, and a bottom surface of the first circuit layer 15 may be substantially coplanar with the top surface of the first dielectric layer 13. The second circuit layer 16 is disposed on a top surface of the second dielectric layer 14, and a bottom surface of the second circuit layer 16 may be substantially coplanar with the top surface of the second dielectric layer 14.

The upper conductive structure 10 may include a plurality of inner vias 17. The inner vias 17 extend through the second dielectric layer 14 and are disposed between the first circuit layer 15 and the second circuit layer 16 for electrically connecting the first circuit layer 15 and the second circuit layer 16. In some embodiments, the second dielectric layer 14 may define a plurality of upper openings 143, and the inner vias 17 may be formed or disposed in the upper openings 143. The inner via 17 and the second circuit layer 16 may be formed integrally. In some embodiments, the inner via 17 may taper downward. That is, a size (e.g., width) of a top portion of the inner via 17 is greater than a size (e.g., width) of a bottom portion of the inner via 17.

The protection layer 18 (e.g., solder mask) covers the second dielectric layer 14 and the second circuit layer 16. In some embodiments, the protection layer 18 may define a plurality of openings 182 to expose a portion of the second circuit layer 16. The exposed portion of the second circuit layer 16 may function as bonding pads for external connection.

The lower conductive structure 20 includes at least one dielectric layer (including, for example, a first dielectric layer 23 and a second dielectric layer 24) and at least one circuit layer (including, for example, a first circuit layer 25 and a second circuit layer 26) in contact with the dielectric layer (e.g., the first dielectric layer 23 and the second dielectric layer 24), at least one inner via 27 and a protection layer 28. In some embodiments, the lower conductive structure 20 may be a low-density conductive structure or a substrate level conductive structure. That is, a line width/line space of the circuit layer (e.g., the first circuit layer 25 and the second circuit layer 26) of the lower conductive structure 20 may be greater than or equal to about 10 μm/10 μm.

In some embodiments, the lower conductive structure 20 may include a plurality of dielectric layers (for example, a first dielectric layer 23 and a second dielectric layer 24) and a plurality of circuit layers (for example, a first circuit layer 25 and a second circuit layer 26). The dielectric layers (e.g., the first dielectric layer 23 and the second dielectric layer 24) are stacked to each other. For example, the second dielectric layer 24 is disposed on a bottom surface of the first dielectric layer 23, thus, the second dielectric layer 24 is the bottommost dielectric layer. Materials of the dielectric layers (e.g., the first dielectric layer 23 and the second dielectric layer 24) may be, for example, polypropylene (PP) or ajinomoto build-up film (ABF).

In addition, the first dielectric layer 23 may define at least one through hole 233 extending the first dielectric layer 23. As shown in FIG. 1, the through hole 233 of the first dielectric layer 23 tapers upward, that is, a size of a top portion of the through hole 233 is less than a size of a bottom portion of the through hole 233.

In some embodiments, the circuit layers (e.g., the first circuit layer 25 and the second circuit layer 26) may be coarse line width/line space circuit layers. That is, a line width/line space of the circuit layers (e.g., the first circuit layer 25 and the second circuit layer 26) may be greater than or equal to about 10 μm/10 μm, or greater than or equal to about 15 μm/15 μm. The first circuit layer 25 is disposed on a bottom surface of the first dielectric layer 23, and a top surface of the first circuit layer 25 may be substantially coplanar with the bottom surface of the first dielectric layer 23. The second circuit layer 26 is disposed on a bottom surface of the second dielectric layer 24, and a top surface of the second circuit layer 26 may be substantially coplanar with the bottom surface of the second dielectric layer 24.

The lower conductive structure 20 may include a plurality of inner vias 27. The inner vias 27 extend through the second dielectric layer 24 and are disposed between the first circuit layer 25 and the second circuit layer 26 for electrically connecting the first circuit layer 25 and the second circuit layer 26. In some embodiments, the second dielectric layer 24 may define a plurality of lower openings 243, and the inner vias 27 may be formed or disposed in the lower openings 243. The inner via 27 and the second circuit layer 26 may be formed integrally. In order to reduce the warpage of the wiring structure 1, the inner via 27 of the lower conductive structure 20 and the inner via 17 of the upper conductive structure 10 may be symmetric structure. For example, a tapering direction of the inner via 17 of the upper conductive structure 10 may be contrary to a tapering direction of the inner via 27 of the lower conductive structure 20. That is, the inner via 27 of the lower conductive structure 20 may taper upward (i.e., a size (e.g., width) of a top portion of the inner via 27 is less than a size (e.g., width) of a bottom portion of the inner via 27) when the inner via 17 of the upper conductive structure 10 tapers downward.

The protection layer 28 (e.g., solder mask) covers the second dielectric layer 24 and the second circuit layer 26. In some embodiments, the protection layer 28 may define a plurality of openings 282 to expose a portion of the second circuit layer 26. The exposed portion of the second circuit layer 26 may function as bonding pads for external connection.

In some embodiments, a metal content of the upper conductive structure 10 may be substantially equal to a metal content of the lower conductive structure 20 to reduce the warpage of the wiring structure 1. The metal content may be designated as a volume ratio of the metal in the conductive structure. In some embodiments, a residual metal ratio (e.g., a residual copper ratio) is a ratio of the area of the metal (e.g., copper) to the entire area of the dielectric layer that the metal (e.g., copper) disposed on from a top view. For example, the residual metal ratio of the second circuit layer 26 of the lower conductive structure 20 may be substantially equal to the residual metal ratio of the second circuit layer 16 of the upper conductive structure 10. In addition, the residual metal ratio of the first circuit layer 25 of the lower conductive structure 20 may be substantially equal to the residual metal ratio of the first circuit layer 15 of the upper conductive structure 10.

The redistribution structure 30 is disposed between the upper conductive structure 10 and the lower conductive structure 20 to electrically connect the upper conductive structure 10 and the lower conductive structure 20. In some embodiments, the redistribution structure 30 may be a high-density redistribution structure or a bumping level redistribution structure. That is, a line width/line space of a circuit layer of the redistribution structure 30 may be less than about 10 μm/10 μm. In some embodiments, a density of a circuit line (including, for example, a trace or a pad) of the high-density redistribution structure (e.g., the redistribution structure 30) is greater than a density of a circuit line of a low-density conductive structure (e.g., the upper conductive structure 10 and the lower conductive structure 20). That is, the count of the circuit line (including, for example, a trace or a pad) in a unit area of the high-density redistribution structure is greater than the count of the circuit line in an equal unit area of the low-density conductive structure, such as about 1.2 times or greater, about 1.5 times or greater, or about 2 times, or about 5 times or greater. Alternatively, a line width/line space (L/S) of the circuit line of the high-density redistribution structure is less than a L/S of the circuit line of the low-density conductive structure, such as about 90% or less, about 50% or less, or about 20% or less.

The redistribution structure 30 has an upper surface 31 and a lower surface 32 opposite to the upper surface 31, and may include a dielectric structure 34, a redistribution layer 36 and a plurality of inner vias (including, for example, inner vias 38 and inner vias 39). The upper surface 31 may contact the upper conductive structure 10 (e.g., a bottom surface of the first dielectric layer 13). The lower surface 32 may contact the lower conductive structure 20 (e.g., a top surface of the first dielectric layer 23).

The dielectric structure 34 may include a plurality of dielectric layers (including, for example, a first dielectric layer 341, a second dielectric layer 342, a third dielectric layer 343 and a fourth dielectric layer 344). The dielectric layers (e.g., the first dielectric layer 341, the second dielectric layer 342, the third dielectric layer 343 and the fourth dielectric layer 344) are stacked to each other. For example, the second dielectric layer 342 is disposed on the first dielectric layer 341, the third dielectric layer 343 is disposed on the second dielectric layer 342, and the fourth dielectric layer 344 is disposed on the third dielectric layer 343. Thus, the fourth dielectric layer 344 is the topmost dielectric layer, and the first dielectric layer 341 is the bottommost dielectric layer. In some embodiments, the dielectric layers (e.g., the first dielectric layer 341, the second dielectric layer 342, the third dielectric layer 343 and the fourth dielectric layer 344) may be made of a cured photoimageable dielectric (PID) material such as epoxy or polyimide (PI) including photoinitiators. In addition, the dielectric layers (e.g., the first dielectric layer 341, the second dielectric layer 342, the third dielectric layer 343 and the fourth dielectric layer 344) may include no fibers (e.g., glass fibers). That is, a material of the dielectric structure 34 (including, for example, the first dielectric layer 341, the second dielectric layer 342, the third dielectric layer 343 and the fourth dielectric layer 344) of the redistribution structure 30 may be different from the material (e.g., PP) of the dielectric layer (including, for example, the first dielectric layer 13 and the second dielectric layer 14) of the upper conductive structure 10 and the material (e.g., PP) of the dielectric layer (including, for example, the first dielectric layer 23 and the second dielectric layer 24) of the lower conductive structure 20. Further, a thickness of each of the dielectric layers (e.g., the first dielectric layer 341, the second dielectric layer 342, the third dielectric layer 343 and the fourth dielectric layer 344) of the dielectric structure 34 of the redistribution structure 30 may be less than a thickness of the dielectric layer (e.g., the first dielectric layer 13 and the second dielectric layer 14) of the upper conductive structure 10 (i.e., the substrate level conductive structure) and a thickness of the dielectric layer (e.g., the first dielectric layer 23 and the second dielectric layer 24) of the lower conductive structure 20 (i.e., the substrate level conductive structure).

The first dielectric layer 341 may contact the first dielectric layer 23 of the lower conductive structure 20. In some embodiments, the first dielectric layer 341 may define at least one through hole 345 extending through the first dielectric layer 341. As shown in FIG. 1, the through hole 345 of the first dielectric layer 341 may be aligned with and in communication with the through hole 233 of the first dielectric layer 23 of the lower conductive structure 20. That is, the through hole 233 of the first dielectric layer 23 of the lower conductive structure 20 and the through hole 345 of the first dielectric layer 341 may constitute at least one lower through hole 62.

The fourth dielectric layer 344 may contact the first dielectric layer 13 of the upper conductive structure 10. In some embodiments, the fourth dielectric layer 344 may define at least one through hole 346 extending through the fourth dielectric layer 344. As shown in FIG. 1, the through hole 346 of the fourth dielectric layer 344 may be aligned with and in communication with the through hole 133 of the first dielectric layer 13 of the upper conductive structure 10. That is, the through hole 133 of the first dielectric layer 13 of the upper conductive structure 10 and the through hole 346 of the fourth dielectric layer 344 may constitute at least one upper through hole 61.

The redistribution layer 36 may be embedded in the dielectric structure 34 and may include at least one circuit layer (including, for example, a topmost circuit layer 361, a bottommost circuit layer 362 and at least one intermediate circuit layer 363). In some embodiments, the circuit layer (e.g., the topmost circuit layer 361, the bottommost circuit layer 362 and the intermediate circuit layer 363) may be a fan-out circuit layer (i.e., a fine line width/line space circuit layer). That is, a line width/line space of the circuit layer (e.g., the topmost circuit layer 361, the bottommost circuit layer 362 and the intermediate circuit layer 363) of the redistribution layer 36 may be less than about 10 μm/10 μm (e.g., less than or equal to 8 μm/8 μm, less than or equal to 5 μm/5 μm, less than or equal to 3 μm/3 μm, or less than or equal to 2 μm/2 μm). Compared to the upper conductive structure 10 and the lower conductive structure 20, the line width/line space of the circuit layer (e.g., the topmost circuit layer 361, the bottommost circuit layer 362 and the intermediate circuit layer 363) of the redistribution layer 36 is less than the line width/line space of the circuit layer (e.g., the first circuit layer 15 and the second circuit layer 16) of the upper conductive structure 10 and the line width/line space of the circuit layer (e.g., the first circuit layer 25 and the second circuit layer 26) of the lower conductive structure 20.

In some embodiments, the redistribution layer 36 may include a plurality of circuit layers (for example, a topmost circuit layer 361, a bottommost circuit layer 362 and at least one intermediate circuit layer 363). The topmost circuit layer 361 may be embedded in fourth dielectric layer 344, and a portion of the topmost circuit layer 361 may be exposed through the through hole 346 of the fourth dielectric layer 344. The bottommost circuit layer 362 may be embedded in the second dielectric layer 342, and a portion of the bottommost circuit layer 362 may be exposed through the through hole 345 of the first dielectric layer 341. The intermediate circuit layer 363 may be embedded in the third dielectric layer 343 and disposed between the topmost circuit layer 361 and the bottommost circuit layer 362. To achieve a high density distribution of the circuit layers (e.g., the topmost circuit layer 361, the bottommost circuit layer 362 and the intermediate circuit layer 363) of the redistribution layer 36, the topmost circuit layer 361 of the redistribution layer 36 may cover more than 60% of a top surface of the third dielectric layer 343 of the dielectric structure 34, the intermediate circuit layer 363 of the redistribution layer 36 may cover more than 60% of a top surface of the second dielectric layer 342 of the dielectric structure 34, and the bottommost circuit layer 362 of the redistribution layer 36 may cover more than 60% of a top surface of the first dielectric layer 341 of the dielectric structure 34. That is, from a top view, an area of the topmost circuit layer 361 of the redistribution layer 36 may be greater than 60% of a surface area of the top surface of the third dielectric layer 343 of the dielectric structure 34, an area of the intermediate circuit layer 363 of the redistribution layer 36 may be greater than 60% of a surface area of the top surface of the second dielectric layer 342 of the dielectric structure 34 and an area of the bottommost circuit layer 362 of the redistribution layer 36 may be greater than 60% of a surface area of the top surface of the first dielectric layer 341 of the dielectric structure 34.

Since the through hole 346 of the fourth dielectric layer 344 and the through hole 345 of the first dielectric layer 341 may be formed through laser drilling, a circumstance of excessive drilling should be taken into consideration. This is due to the topmost circuit layer 361 and the bottommost circuit layer 362 may be drilled through in the circumstance of excessive drilling, thereby causing a short circuit in the topmost circuit layer 361 and the bottommost circuit layer 362. To prevent the topmost circuit layer 361 and the bottommost circuit layer 362 from being drilled through during laser drilling, a thickness t2 of the bottommost circuit layer 362 may be substantially equal to a thickness t1 of the topmost circuit layer 361, and the thickness t1 of the topmost circuit layer 361 and the thickness t2 of the bottommost circuit layer 362 may be increased to greater than or equal to about 5 μm. As a result, the laser drilling may be stopped on the topmost circuit layer 361 and the bottommost circuit layer 362. That is, the topmost circuit layer 361 and the bottommost circuit layer 362 may not be drilled through in the circumstance of excessive drilling. In some embodiments, at least one upper dimple 365 may be formed on the topmost circuit layer 361 and at least one lower dimple 367 may be formed on the bottommost circuit layer 362 after excessive drilling. The upper dimple 365 of the topmost circuit layer 361 may be recessed from a top surface 364 of the topmost circuit layer 361 and in communication with the through hole 346 of the fourth dielectric layer 344. The lower dimple 367 of the bottommost circuit layer 362 may be recessed from a bottom surface 366 of the bottommost circuit layer 362 and in communication with the through hole 345 of the first dielectric layer 341.

The intermediate circuit layer 363 may be protected by the topmost circuit layer 361 and the bottommost circuit layer 362. Thus, a thickness t3 of the intermediate circuit layer 363 may not necessary to be increased. That is, the thickness t3 of the intermediate circuit layer 363 may be less than the thickness t1 of the topmost circuit layer 361 and the thickness t2 of the bottommost circuit layer 362. In some embodiments, the thickness t3 of the intermediate circuit layer 363 may be less than or equal to about 3 μm.

The inner vias (e.g., the inner vias 38 and the inner vias 39) may be disposed between the topmost circuit layer 361 and the intermediate circuit layer 363 (e.g., the inner vias 38) and between the bottommost circuit layer 362 and the intermediate circuit layer 363 (e.g., the inner vias 39) for electrically connecting the topmost circuit layer 361 and the intermediate circuit layer 363 (e.g., the inner vias 38) and electrically connecting the bottommost circuit layer 362 and the intermediate circuit layer 363 (e.g., the inner vias 39). In some embodiments, the inner vias 38 may extend through the third dielectric layer 343, and the inner vias 39 may extend through the second dielectric layer 342. The inner vias 38 and the topmost circuit layer 361 may be formed integrally. The inner vias 39 and the intermediate circuit layer 363 may be formed integrally. In some embodiments, the inner vias 38 and the inner vias 39 may taper downward.

The upper conductive via 40 is formed or disposed in the through hole 133 of the first dielectric layer 13 of the upper conductive structure 10 and the through hole 346 of the fourth dielectric layer 344 of the dielectric structure 34 of the redistribution structure 30, and extends into the upper dimple 365 of the topmost circuit layer 361 of the redistribution layer 36 of the redistribution structure 30. Thus, the upper conductive via 40 extends through the first dielectric layer 13 of the upper conductive structure 10 and a portion (e.g., the fourth dielectric layer 344) of the dielectric structure 34 of the redistribution structure 30, and is electrically connected to the topmost circuit layer 361 of the redistribution layer 36 of the redistribution structure 30 and the circuit layer (e.g., the first circuit layer 15) of the upper conductive structure 10. In some embodiments, a tapering direction of the upper conductive via 40 may be the same as a tapering direction of the inner via 17 of the upper conductive structure 10. As shown in FIG. 1, the upper conductive via 40 may taper downward. In some embodiments, the upper conductive via 40 may be a monolithic structure or a bulk structure, and a peripheral surface of the upper conductive via 40 may be a substantially continuous plane. The upper conductive via 40 and the first circuit layer 15 of the upper conductive structure 10 may be formed integrally.

In some embodiments, the at least one upper conductive via 40 may include a plurality of upper conductive vias 40. Since the topmost circuit layer 361 of the redistribution layer 36 has fine line width/line space, at least three traces 368 of the topmost circuit layer 361 of the redistribution layer 36 may be disposed between two adjacent upper conductive vias 40.

The lower conductive via 50 is formed or disposed in the through hole 233 of the first dielectric layer 23 of the lower conductive structure 20 and the through hole 345 of the first dielectric layer 341 of the dielectric structure 34 of the redistribution structure 30, and extends into the lower dimple 367 of the bottommost circuit layer 362 of the redistribution layer 36 of the redistribution structure 30. Thus, the lower conductive via 50 extends through the first dielectric layer 23 of the lower conductive structure 20 and a portion (e.g., the first dielectric layer 341) of the dielectric structure 34 of the redistribution structure 30, and is electrically connected to the bottommost circuit layer 362 of the redistribution layer 36 of the redistribution structure 30 and the circuit layer (e.g., the first circuit layer 25) of the lower conductive structure 20. In some embodiments, a tapering direction of the lower conductive via 50 may be the same as a tapering direction of the inner via 27 of the lower conductive structure 20. As shown in FIG. 1, the lower conductive via 50 may taper upward. In some embodiments, the lower conductive via 50 may be a monolithic structure or a bulk structure, and a peripheral surface of the lower conductive via 50 may be a substantially continuous plane. The lower conductive via 50 and the first circuit layer 25 of the lower conductive structure 20 may be formed integrally.

In some embodiments, the at least one lower conductive via 50 may include a plurality of lower conductive vias 50. Since the bottommost circuit layer 362 of the redistribution layer 36 has fine line width/line space, at least three traces 369 of the bottommost circuit layer 362 of the redistribution layer 36 may be disposed between two adjacent lower conductive vias 50.

As shown in the embodiment illustrated in FIG. 1, the wiring structure 1 is a combination of the upper conductive structure 10, the redistribution structure 30 and the lower conductive structure 20, in which the circuit layers (e.g., the topmost circuit layer 361, the bottommost circuit layer 362 and the intermediate circuit layer 363) of the redistribution layer 36 of the redistribution structure 30 have fine line width/line space, high yield and low thickness; the circuit layers (e.g., the first circuit layer 15 and the second circuit layer 16) of the upper conductive structure 10 and the circuit layers (e.g., the first circuit layer 25 and the second circuit layer 26) of the lower conductive structure 20 have coarse line width/line space and low manufacturing cost. Thus, a number of the circuit layers of the upper conductive structure 10 (i.e., the substrate level conductive structure) and a number of the circuit layers of the lower conductive structure 20 (i.e., the substrate level conductive structure) may be significantly reduced through the use of the redistribution structure 30 (i.e., the bumping level redistribution structure). For example, a 12-layer (i.e., 12 circuit layers) wiring structure including a 6-layer (i.e., 6 circuit layers) upper conductive structure and a 6-layer (i.e., 6 circuit layers) lower conductive structure may be simplified to a 7-layer (i.e., 7 circuit layers) wiring structure (e.g., the wiring structure 1) including a 2-layer (i.e., 2 circuit layers) upper conductive structure (e.g., the upper conductive structure 10), a 2-layer (i.e., 2 circuit layers) lower conductive structure (e.g., the lower conductive structure 20) and a 3-layer (i.e., 3 circuit layers) redistribution structure (e.g., the redistribution structure 30). As a result, the yield of the wiring structure 1 may be significantly improved, and a thickness of the wiring structure 1 may be reduced.

Figure 2:
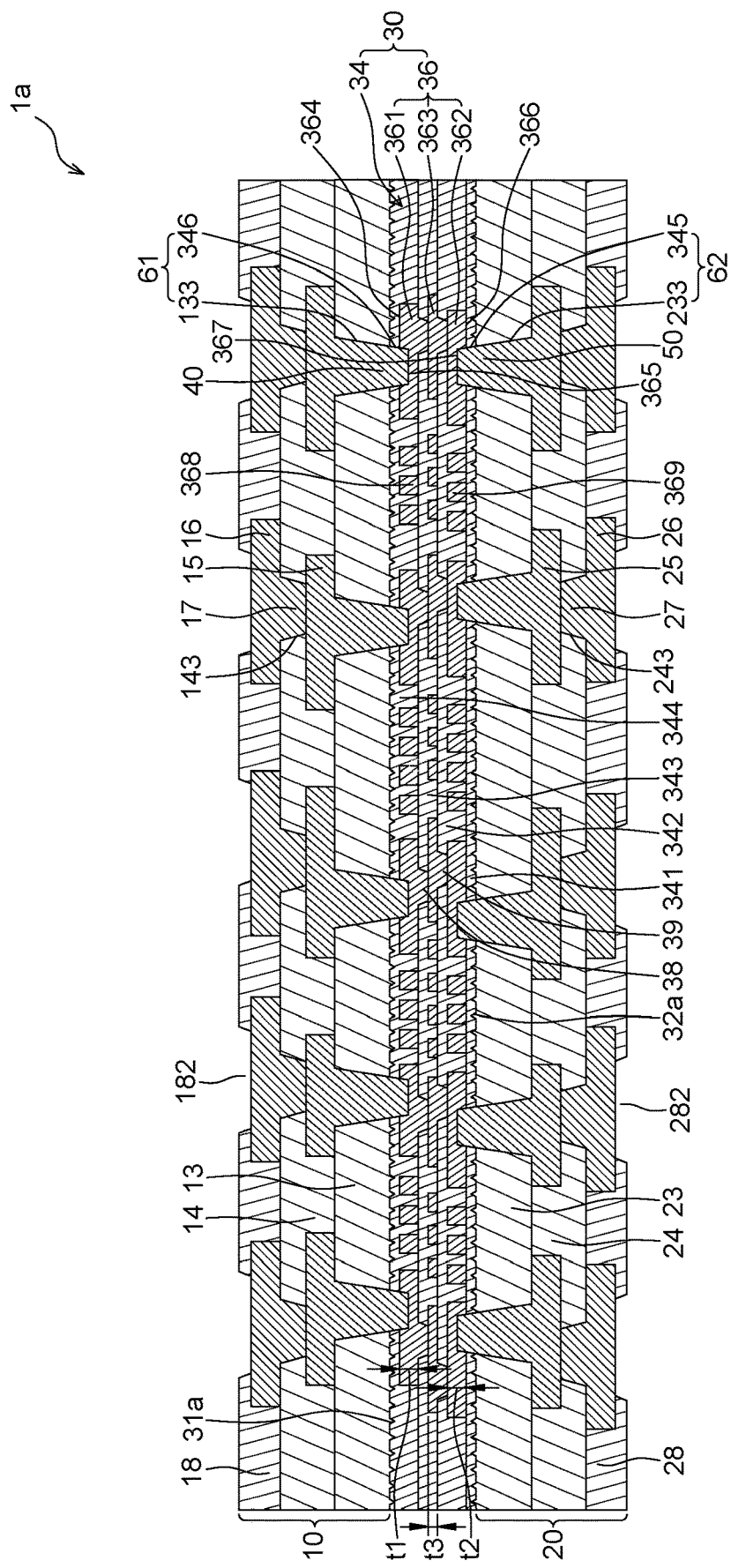
FIG. 2 illustrates a cross-sectional view of a wiring structure according to some embodiments of the present disclosure.

FIG. 2 illustrates a cross-sectional view of a wiring structure 1a according to some embodiments of the present disclosure. The wiring structure 1a is similar to the wiring structure 1 shown in FIG. 1, except for the structures of the upper surface 31a and the lower surface 32a of the redistribution structure 30. As shown in FIG. 2, the upper surface 31a and the lower surface 32a of the redistribution structure 30 may be rough surfaces, and surface roughnesses (Ra) of the upper surface 31a and the lower surface 32a may be about 0.5 µm to about 1.5 µm. That is, a surface roughness of a boundary between the redistribution structure 30 and the upper conductive structure 10 may be greater than a surface roughness of a boundary between two adjacent dielectric layers (e.g., the third dielectric layer 343 and the fourth dielectric layer 344) of the dielectric structure 34 of the redistribution structure 30, and a surface roughness of a boundary between the redistribution structure 30 and the lower conductive structure 20 may be greater than a surface roughness of a boundary between two adjacent dielectric layers (e.g., the first dielectric layer 341 and the second dielectric layer 342) of the dielectric structure 34 of the redistribution structure 30. As a result, a bonding strength between the redistribution structure 30 and the upper conductive structure 10 and a bonding strength between the redistribution structure 30 and the lower conductive structure 20 may be further improved.

Figure 3:
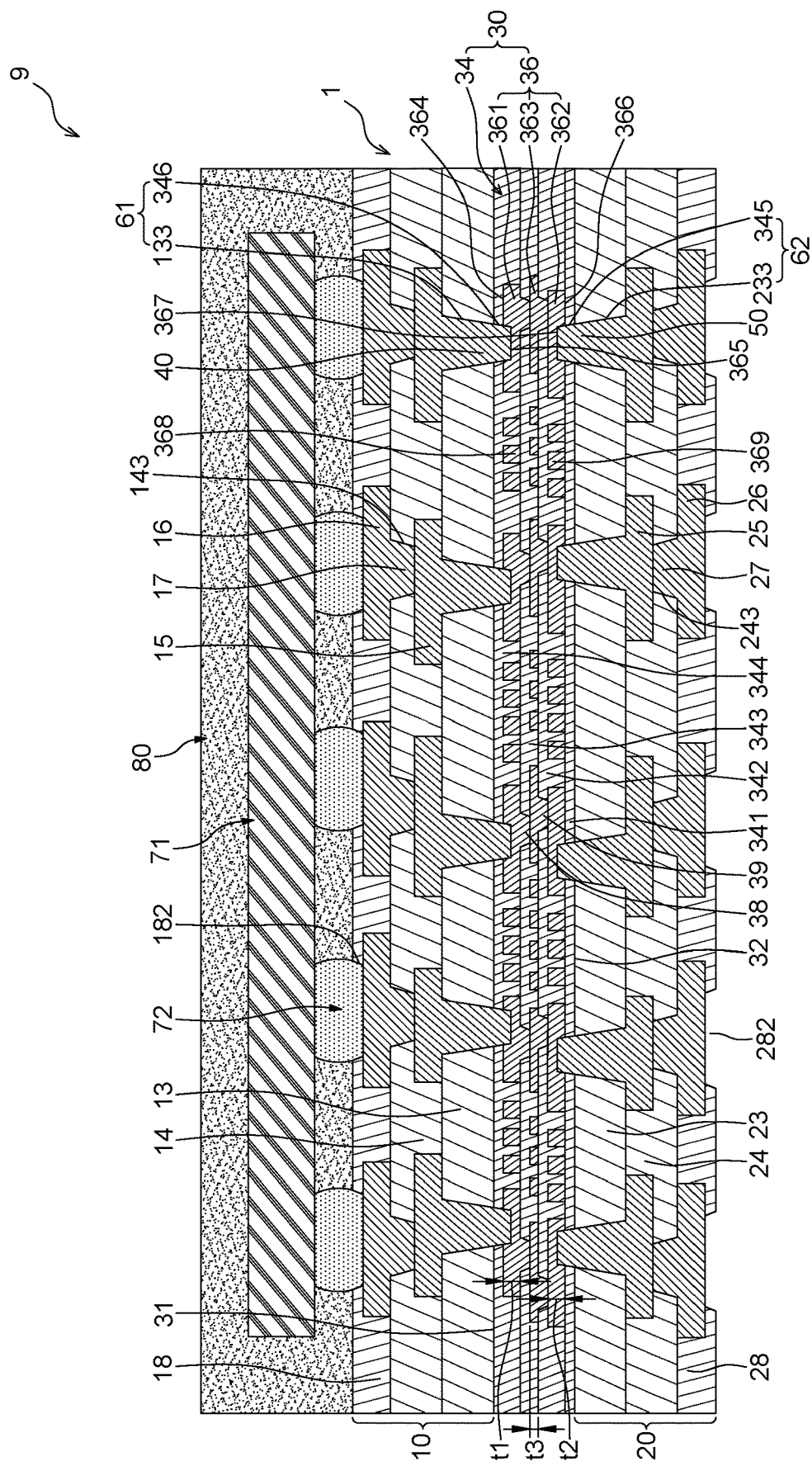
FIG. 3 illustrates a cross-sectional view of a package structure according to some embodiments of the present disclosure.

FIG. 3 illustrates a cross-sectional view of a package structure 9 according to some embodiments of the present disclosure. The package structure 9 includes a wiring structure 1, a semiconductor device 71, a plurality of connecting elements 72 and an encapsulant 80. The wiring structure 1 of FIG. 3 may be the same as the wiring structure 1 shown in FIG. 1. The semiconductor device 71 may be, for example, a semiconductor die or a semiconductor chip. The semiconductor device 71 is electrically connected and bonded to the second circuit layer 16 of the upper conductive structure 10 through the connecting elements 72 (e.g., solders or bumps). The encapsulant 80 (e.g., molding compound with or without fillers) is formed or disposed on the wiring structure 1 to cover the semiconductor device 71 and the connecting elements 72.

FIG. 4 through FIG. 12 illustrate a method for manufacturing a wiring structure according to some embodiments of the present disclosure. In some embodiments, the method is for manufacturing a wiring structure such as the wiring structure 1 shown in FIG. 1.

Figure 4:
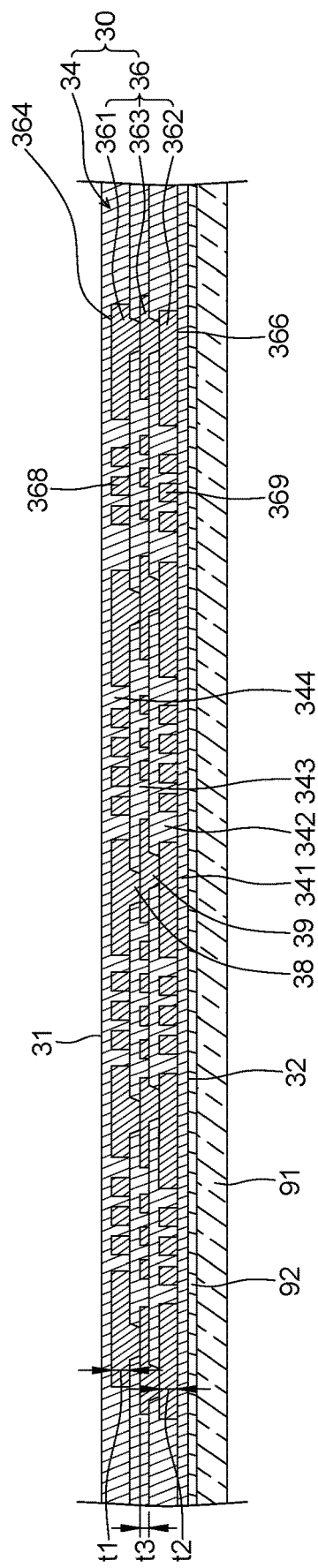
FIG. 4 illustrates one or more stages of an example of a method for manufacturing a wiring structure according to some embodiments of the present disclosure.

Referring to FIG. 4, a redistribution structure 30 is provided. The redistribution structure 30 is formed or disposed on a release layer 92 that is formed or disposed on a carrier 91. The redistribution structure 30 has an upper surface 31 and a lower surface 32 opposite to the upper surface 31, and may include a dielectric structure 34, a redistribution layer 36 and a plurality of inner vias (including, for example, inner vias 38 and inner vias 39).

The dielectric structure 34 may include a plurality of dielectric layers (including, for example, a first dielectric layer 341, a second dielectric layer 342, a third dielectric layer 343 and a fourth dielectric layer 344). The dielectric layers (e.g., the first dielectric layer 341, the second dielectric layer 342, the third dielectric layer 343 and the fourth dielectric layer 344) are stacked to each other. For example, the second dielectric layer 342 is formed or disposed on the first dielectric layer 341, the third dielectric layer 343 is formed or disposed on the second dielectric layer 342, and the fourth dielectric layer 344 is formed or disposed on the third dielectric layer 343. Thus, the fourth dielectric layer 344 is the topmost dielectric layer, and the first dielectric layer 341 is the bottommost dielectric layer. In some embodiments, the dielectric layers (e.g., the first dielectric layer 341, the second dielectric layer 342, the third dielectric layer 343 and the fourth dielectric layer 344) may be made of a cured photoimageable dielectric (PID) material such as epoxy or polyimide (PI) including photoinitiators.

The redistribution layer 36 may be embedded in the dielectric structure 34 and may include at least one circuit layer (including, for example, a topmost circuit layer 361, a bottommost circuit layer 362 and at least one intermediate circuit layer 363). In some embodiments, the circuit layer (e.g., the topmost circuit layer 361, the bottommost circuit layer 362 and the intermediate circuit layer 363) may be a fan-out circuit layer (i.e., a fine line width/line space circuit layer). That is, a line width/line space of the circuit layer (e.g., the topmost circuit layer 361, the bottommost circuit layer 362 and the intermediate circuit layer 363) of the redistribution layer 36 may be less than about 10 µm/10 µm (e.g., less than or equal to 8 µm/8 µm, less than or equal to 5 µm/5 µm, less than or equal to 3 µm/3 µm, or less than or equal to 2 µm/2 µm).

In some embodiments, the redistribution layer 36 may include a plurality of circuit layers (for example, a topmost circuit layer 361, a bottommost circuit layer 362 and at least one intermediate circuit layer 363). The topmost circuit layer 361 may be embedded in fourth dielectric layer 344. The topmost circuit layer 361 may include a plurality of traces 368 spaced apart from each other. The bottommost circuit layer 362 may be embedded in the second dielectric layer 342. The bottommost circuit layer 362 may include a plurality of traces 369 spaced apart from each other. The intermediate circuit layer 363 may be embedded in the third dielectric layer 343 and disposed between the topmost circuit layer 361 and the bottommost circuit layer 362. To achieve a high density distribution of the circuit layers (e.g., the topmost circuit layer 361, the bottommost circuit layer 362 and the intermediate circuit layer 363) of the redistribution layer 36, the topmost circuit layer 361 of the redistribution layer 36 may cover more than 60% of a top surface of the third dielectric layer 343 of the dielectric structure 34, the intermediate circuit layer 363 of the redistribution layer 36 may cover more than 60% of a top surface of the second dielectric layer 342 of the dielectric structure 34, and the bottommost circuit layer 362 of the redistribution layer 36 may cover more than 60% of a top surface of the first dielectric layer 341 of the dielectric structure 34. That is, from a top view, an area of the topmost circuit layer 361 of the redistribution layer 36 may be greater than 60% of a surface area of the top surface of the third dielectric layer 343 of the dielectric structure 34, an area of the intermediate circuit layer 363 of the redistribution layer 36 may be greater than 60% of a surface area of the top surface of the second dielectric layer 342 of the dielectric structure 34, and an area of the bottommost circuit layer 362 of the redistribution layer 36 may be greater than 60% of a surface area of the top surface of the first dielectric layer 341 of the dielectric structure 34.

The inner vias (e.g., the inner vias 38 and the inner vias 39) may be disposed between the topmost circuit layer 361 and the intermediate circuit layer 363 (e.g., the inner vias 38) and between the bottommost circuit layer 362 and the intermediate circuit layer 363 (e.g., the inner vias 39) for electrically connecting the topmost circuit layer 361 and the intermediate circuit layer 363 (e.g., the inner vias 38) and electrically connecting the bottommost circuit layer 362 and the intermediate circuit layer 363 (e.g., the inner vias 39). In some embodiments, the inner vias 38 may extend through the third dielectric layer 343, and the inner vias 39 may extend through the second dielectric layer 342. The inner vias 38 and the topmost circuit layer 361 may be formed integrally. The inner vias 39 and the intermediate circuit layer 363 may be formed integrally. In some embodiments, the inner vias 38 and the inner vias 39 may taper downward.

Referring to FIG. 5 through FIG. 12, an upper conductive structure 10 is formed on the upper surface 31 of the redistribution structure 30 and a lower conductive structure 20 is formed on the lower surface 32 of the redistribution structure 30.

Figure 5:
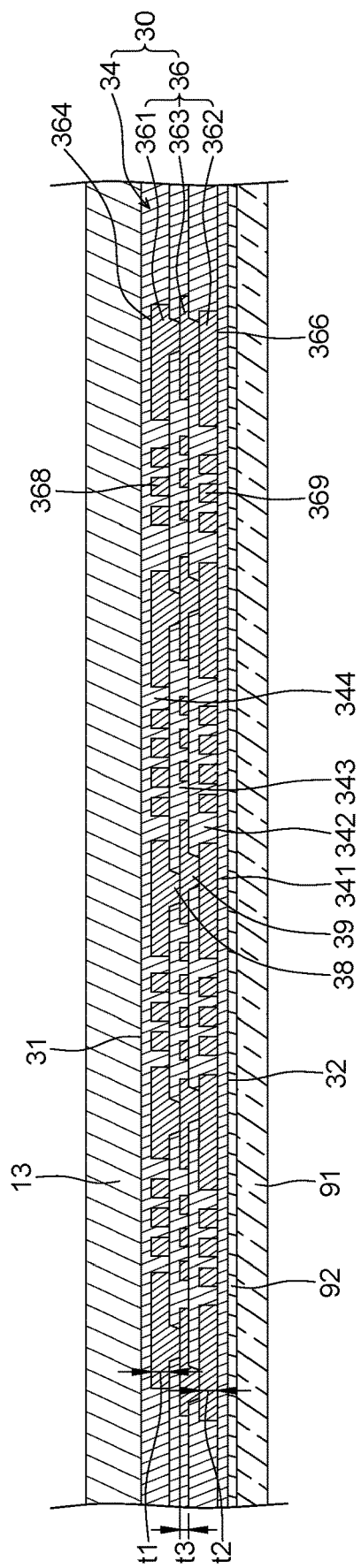
FIG. 5 illustrates one or more stages of an example of a method for manufacturing a wiring structure according to some embodiments of the present disclosure.

Referring to FIG. 5, a first upper dielectric layer (or a first dielectric layer) 13 is formed on the upper surface 31 (i.e., a top surface of the fourth dielectric layer 344) of the redistribution structure 30. A material of the first upper dielectric layer (or the first dielectric layer) 13 may be, for example, polypropylene (PP) or ajinomoto build-up film (ABF). In some embodiments, the first upper dielectric layer (or the first dielectric layer) 13 may be pre-cured for at least 30 minutes, to prevent the redistribution structure 30 from generating warpage after removing the carrier 91 and the release layer 92.

Figure 6:
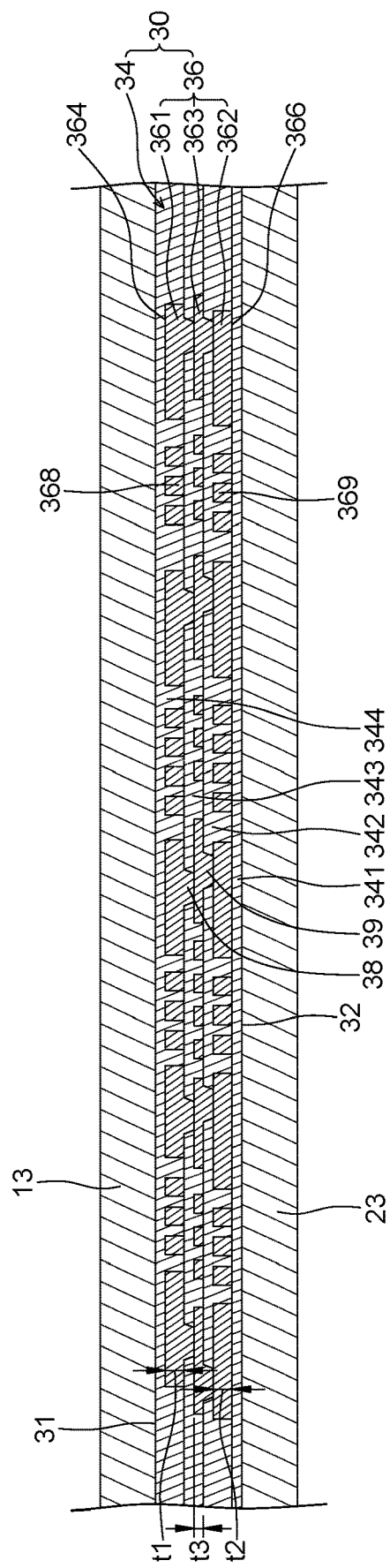
FIG. 6 illustrates one or more stages of an example of a method for manufacturing a wiring structure according to some embodiments of the present disclosure.

Referring to FIG. 6, the carrier 91 and the release layer 92 are removed, and a first lower dielectric layer (or a first dielectric layer) 23 is formed on the lower surface 32 (i.e., a bottom surface of the first dielectric layer 341) of the redistribution structure 30. A material of the first lower dielectric layer (or the first dielectric layer) 23 may be, for example, polypropylene (PP) or ajinomoto build-up film (ABF).

Then, the first upper dielectric layer (or the first dielectric layer) 13 and the first lower dielectric layer (or the first dielectric layer) 23 may be full-cured for at least 2 hours, to prevent the redistribution structure 30 from generating warpage.

Figure 7:
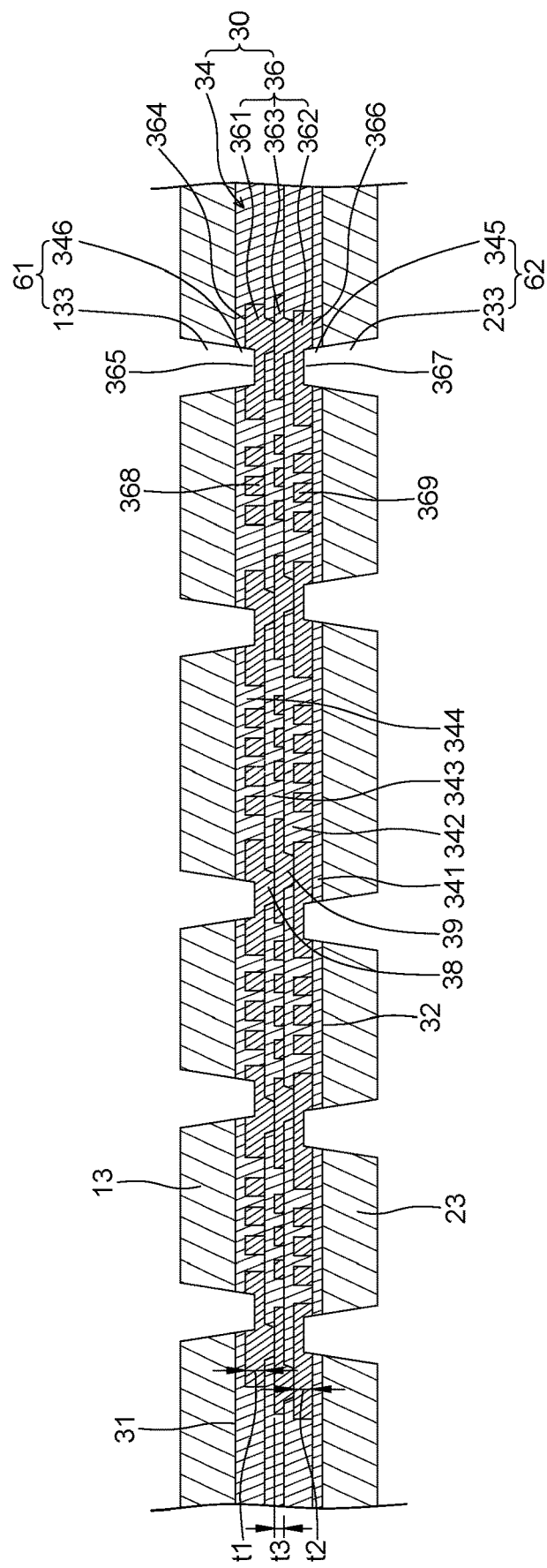
FIG. 7 illustrates one or more stages of an example of a method for manufacturing a wiring structure according to some embodiments of the present disclosure.

Referring to FIG. 7, at least one upper through hole 61 is formed to extend through the first upper dielectric layer (or the first dielectric layer) 13 and a portion (e.g., the fourth dielectric layer 344) of the dielectric structure 34 of the redistribution structure 30 to expose a portion of the topmost circuit layer 361 of the redistribution layer 36 by, for example, laser drilling; and at least one lower through hole 62 is formed to extend through the first lower dielectric layer (or the first dielectric layer) 23 and a portion (e.g., the first dielectric layer 341) of the dielectric structure 34 of the redistribution structure 30 to expose a portion of the bottommost circuit layer 362 of the redistribution layer 36 by, for example, laser drilling.

Meanwhile, at least one through hole 133 is formed to extend through the first upper dielectric layer (or the first dielectric layer) 13 and at least one through hole 346 is formed to extend through the fourth dielectric layer 344 of the dielectric structure 34 after the formation of the upper through hole 61, and at least one through hole 233 is formed to extend through the first lower dielectric layer (or the first dielectric layer) 23 and at least one through hole 345 is formed to extend through the first dielectric layer 341 of the dielectric structure 34 after the formation of the lower through hole 62. That is, the through hole 133 of the first upper dielectric layer (or the first dielectric layer) 13 and the through hole 346 of the fourth dielectric layer 344 constitute the upper through hole 61, and the through hole 233 of the first lower dielectric layer (or the first dielectric layer) 23 and the through hole 345 of the first dielectric layer 341 constitute the lower through hole 62.

In the circumstance of excessive drilling, at least one upper dimple 365 may be formed on the topmost circuit layer 361 during the formation of the upper through hole 61, and at least one lower dimple 367 may be formed on the bottommost circuit layer 362 during the formation of the lower through hole 62. That is, the upper dimple 365 of the topmost circuit layer 361 may be in communication with the upper through hole 61, and the lower dimple 367 of the bottommost circuit layer 362 may be in communication with the lower through hole 62. In addition, the upper dimple 365 of the topmost circuit layer 361 may be recessed from a top surface 364 of the topmost circuit layer 361, and the lower dimple 367 of the bottommost circuit layer 362 may be recessed from a bottom surface 366 of the bottommost circuit layer 362.

Figure 8:
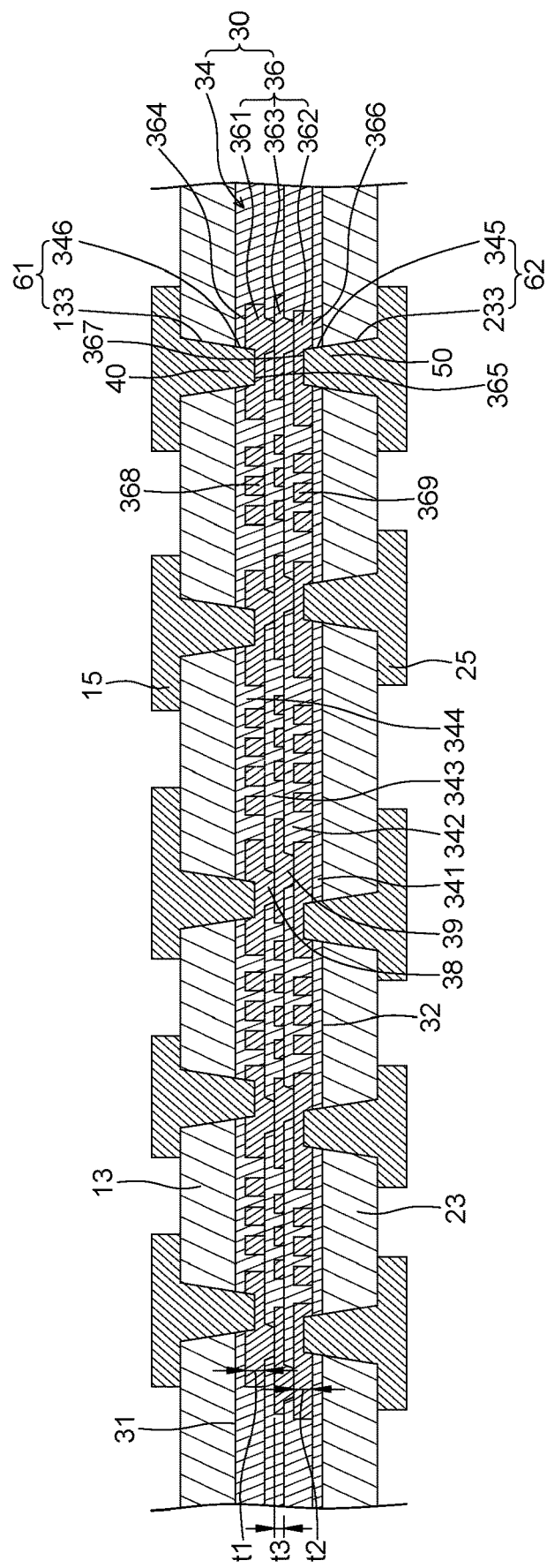
FIG. 8 illustrates one or more stages of an example of a method for manufacturing a wiring structure according to some embodiments of the present disclosure.

Referring to FIG. 8, at least one upper conductive via 40 is formed in the upper through hole 61, in the upper dimple 365 and on the exposed portion of the topmost circuit layer 361 to electrically connect or contact the topmost circuit layer 361; and at least one lower conductive via 50 is formed in the lower through hole 62, in the lower dimple 367 and on the exposed portion of the bottommost circuit layer 362 to electrically connect or contact the bottommost circuit layer 362. Meanwhile, a first upper circuit layer (or a first circuit layer) 15 is formed on a top surface of the first upper dielectric layer (or the first dielectric layer) 13 and electrically connected to the upper conductive via 40, and a first lower circuit layer (or a first circuit layer) 25 is formed on a bottom surface of the first lower dielectric layer (or the first dielectric layer) 23 and electrically connected to the lower conductive via 50. In some embodiments, the first upper circuit layer (or the first circuit layer) 15 and the upper conductive via 40 may be formed integrally, and the first lower circuit layer (or the first circuit layer) 25 and the lower conductive via 50 may be formed integrally.

Figure 9:
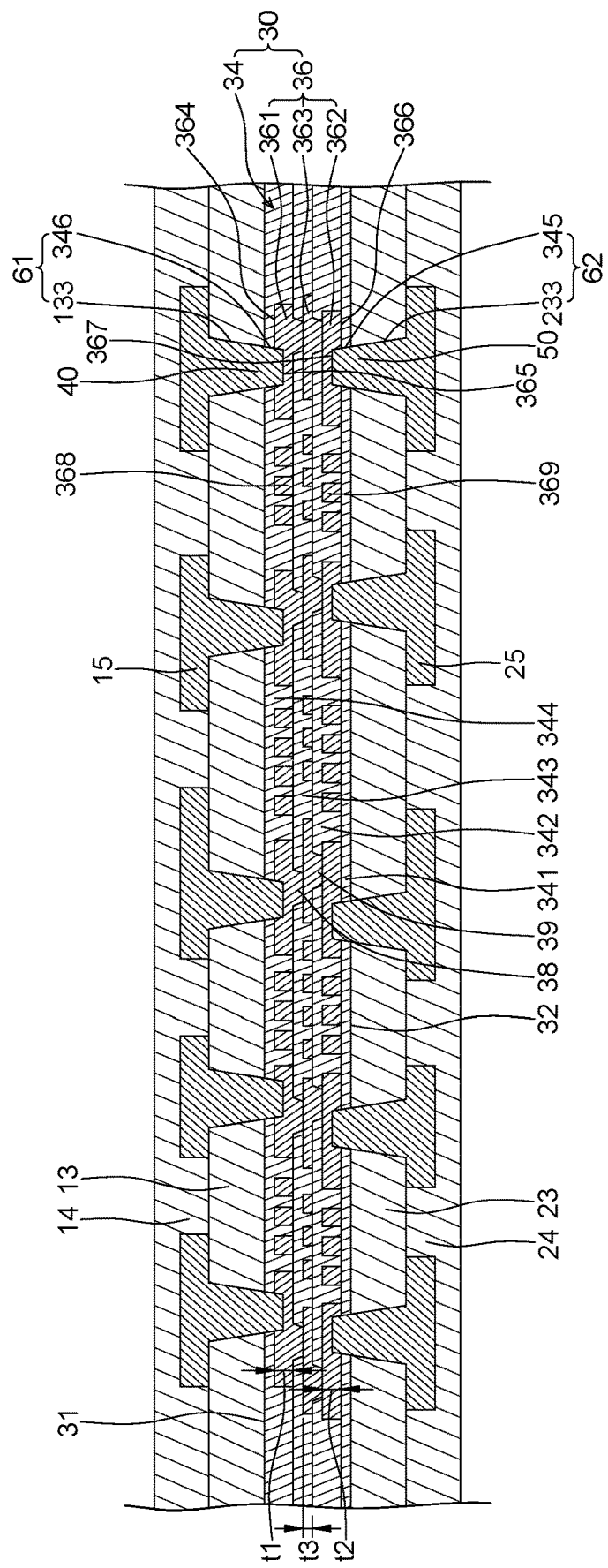
FIG. 9 illustrates one or more stages of an example of a method for manufacturing a wiring structure according to some embodiments of the present disclosure.

Referring to FIG. 9, a second upper dielectric layer (or a second dielectric layer) 14 is formed on a top surface of the first upper dielectric layer (or the first dielectric layer) 13 to cover the first upper circuit layer (or the first circuit layer) 15, and a second lower dielectric layer (or a second dielectric layer) 24 is formed on a bottom surface of the first lower dielectric layer (or the first dielectric layer) 23 to cover the first lower circuit layer (or the first circuit layer) 25. A material of the second upper dielectric layer (or the second dielectric layer) 14 may be, for example, polypropylene (PP) or ajinomoto build-up film (ABF). A material of the second lower dielectric layer (or the second dielectric layer) 24 may be, for example, polypropylene (PP) or ajinomoto build-up film (ABF).

Figure 10:
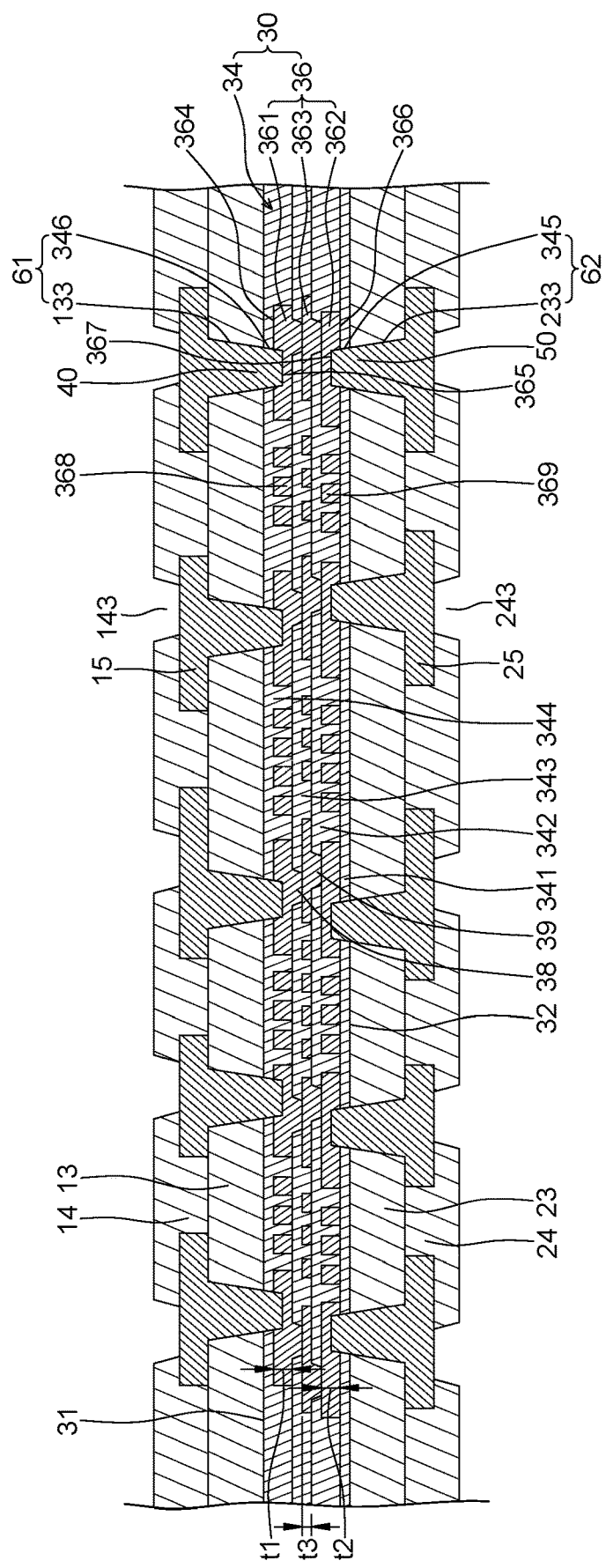
FIG. 10 illustrates one or more stages of an example of a method for manufacturing a wiring structure according to some embodiments of the present disclosure.

Referring to FIG. 10, a plurality of upper openings 143 are formed to extend through the second upper dielectric layer (or the second dielectric layer) 14 to expose a portion of the first upper circuit layer (or the first circuit layer) 15 by, for example, laser drilling; and a plurality of lower openings 243 are formed to extend through the second lower dielectric layer (or the second dielectric layer) 24 to expose a portion of the first lower circuit layer (or the first circuit layer) 25 by, for example, laser drilling.

Figure 11:
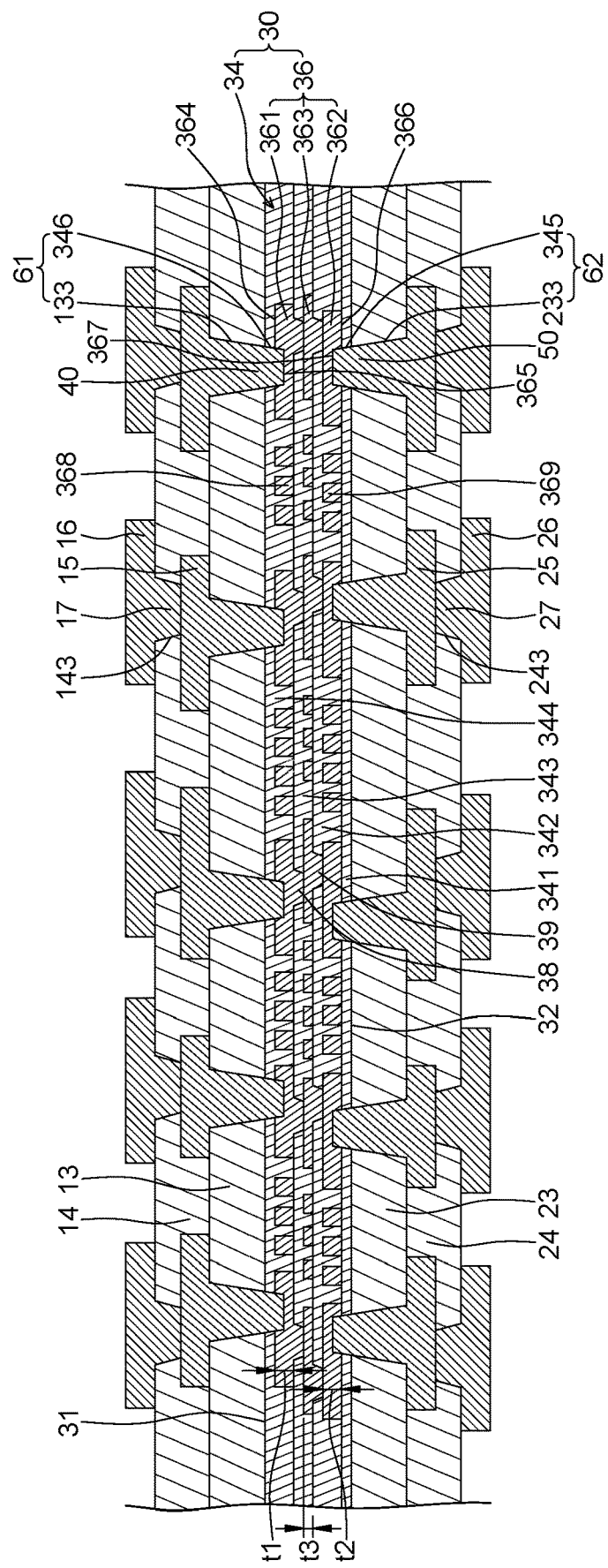
FIG. 11 illustrates one or more stages of an example of a method for manufacturing a wiring structure according to some embodiments of the present disclosure.

Referring to FIG. 11, a plurality of inner vias 17 are formed in the upper openings 143 and on the exposed portion of the first upper circuit layer (or the first circuit layer) 15; and a plurality of inner vias 27 are formed in the lower openings 243 and on the exposed portion of the first lower circuit layer (or the first circuit layer) 25. Meanwhile, a second upper circuit layer (or a second circuit layer) 16 is formed on a top surface of the second upper dielectric layer (or the second dielectric layer) 14 and electrically connected to the inner vias 17, and a second lower circuit layer (or a second circuit layer) 26 is formed on a bottom surface of the second lower dielectric layer (or the second dielectric layer) 24 and electrically connected to the inner vias 27. In some embodiments, the second upper circuit layer (or the second circuit layer) 16 and the inner vias 17 may be formed integrally, and the second lower circuit layer (or the second circuit layer) 26 and the inner vias 27 may be formed integrally.

Figure 12:
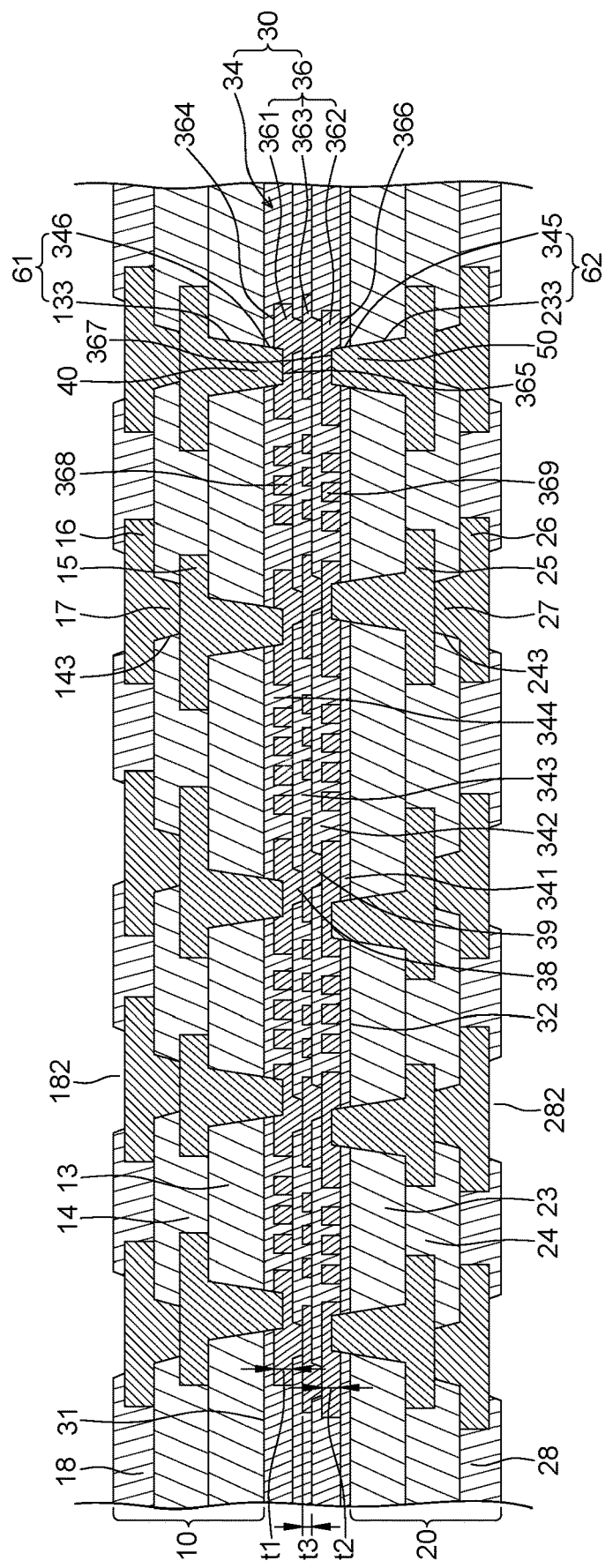
FIG. 12 illustrates one or more stages of an example of a method for manufacturing a wiring structure according to some embodiments of the present disclosure.

Referring to FIG. 12, a protection layer 18 (e.g., solder mask) is formed to cover the second upper dielectric layer (or the second dielectric layer) 14 and the second upper circuit layer (or the second circuit layer) 16, and a protection layer 28 (e.g., solder mask) is formed to cover the second lower dielectric layer (or the second dielectric layer) 24 and the second lower circuit layer (or the second circuit layer) 26. In some embodiments, the protection layer 18 may define a plurality of openings 182 to expose a portion of the second upper circuit layer (or the second circuit layer) 16, and the protection layer 28 may define a plurality of openings 282 to expose a portion of the second lower circuit layer (or the second circuit layer) 26. As shown in FIG. 12, the first upper dielectric layer (or the first dielectric layer) 13, the second upper dielectric layer (or the second dielectric layer) 14, the first upper circuit layer (or the first circuit layer), the second upper circuit layer (or the second circuit layer) 16, the inner vias 17 and the protection layer 18 may constitute the upper conductive structure 10. The first lower dielectric layer (or the first dielectric layer) 23, the second lower dielectric layer (or the second dielectric layer) 24, the first lower circuit layer (or the first circuit layer) 25, the second lower circuit layer (or the second circuit layer) 26, the inner vias 27 and the protection layer 28 may constitute the lower conductive structure 20. In addition, the upper conductive structure 10 may be electrically connected to the redistribution structure 30 through the upper conductive via 40, and the lower conductive structure 20 may be electrically connected to the redistribution structure 30 through the lower conductive via 50.

Then, a singulation process is conducted to obtain a plurality of wiring structures 1 of FIG. 1.

Figure 13:
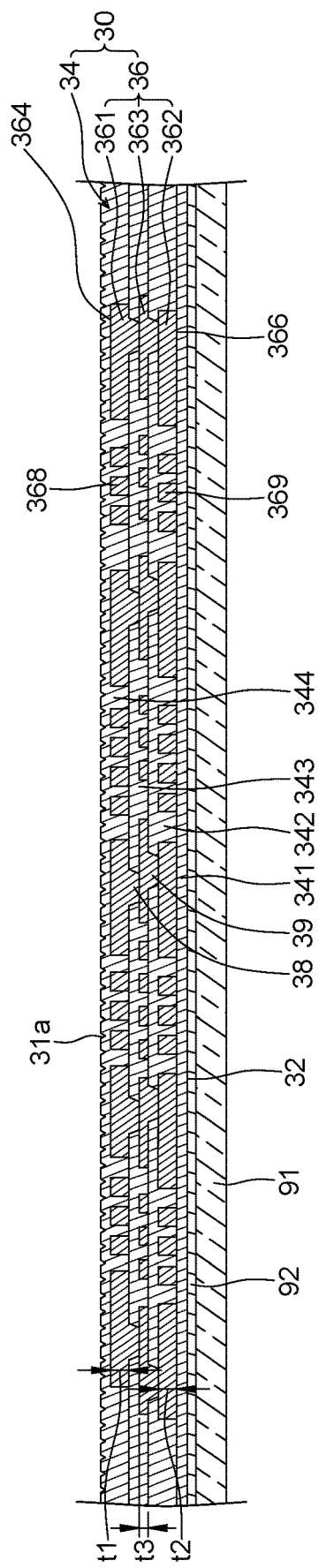
FIG. 13 illustrates one or more stages of an example of a method for manufacturing a wiring structure according to some embodiments of the present disclosure.
Figure 14:
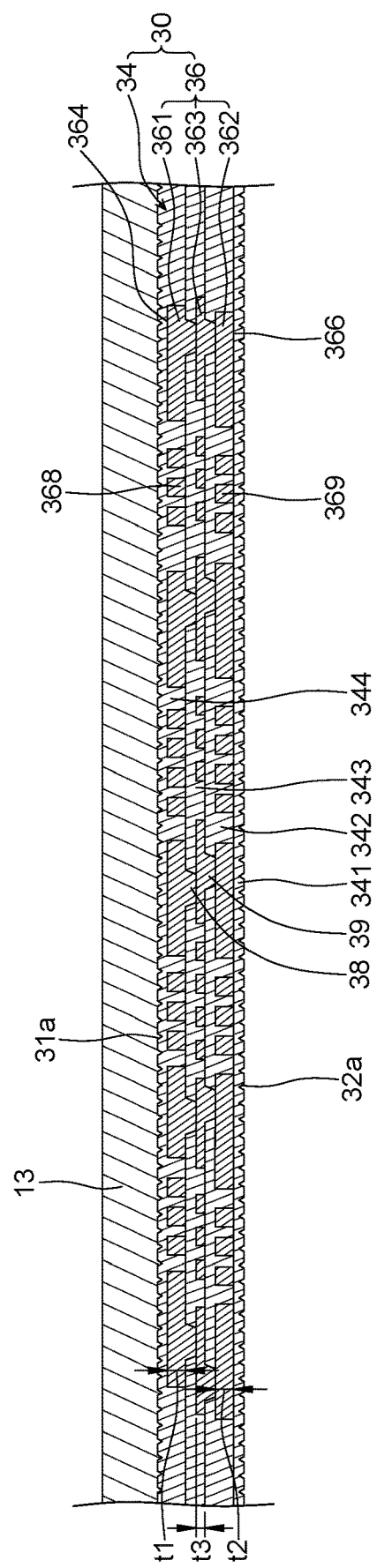
FIG. 14 illustrates one or more stages of an example of a method for manufacturing a wiring structure according to some embodiments of the present disclosure.

FIG. 13 through FIG. 14 illustrate one or more stages of an example of a method for manufacturing a wiring structure according to some embodiments of the present disclosure. In the stage illustrated in FIG. 4, the upper surface 31 of the redistribution structure 30 may be roughed to obtain the upper surface 31a shown in FIG. 13. Referring to FIG. 14, the carrier 91 and the release layer 92 are removed, and then, the lower surface 32 of the redistribution structure 30 may be roughed to obtain the lower surface 32a. The upper surface 31a and the lower surface 32a of the redistribution structure 30 are rough surfaces, and surface roughnesses of the upper surface 31a and the lower surface 32a may be about 0.5 μm to about 1.5 μm.

Then, the stages illustrated in FIG. 6 through FIG. 12 may be performed after the stage illustrated in FIG. 14 to obtain the wiring structure 1a shown in FIG. 2.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
    an upper conductive structure including at least one dielectric layer and at least one circuit layer in contact with the dielectric layer;
    a lower conductive structure including at least one dielectric layer and at least one circuit layer in contact with the dielectric layer;
    a redistribution structure disposed between the upper conductive structure and the lower conductive structure to electrically connect the upper conductive structure and the lower conductive structure, wherein the redistribution structure includes a dielectric structure and a redistribution layer embedded in the dielectric structure, the redistribution layer includes at least one circuit layer, and a line width of the circuit layer of the redistribution layer is less than a line width of the circuit layer of the upper conductive structure and a line width of the circuit layer of the lower conductive structure; and at least one upper conductive via extending through the dielectric layer of the upper conductive structure and a portion of the dielectric structure of the redistribution structure and electrically connected to the redistribution layer of the redistribution structure and the circuit layer of the upper conductive structure;

wherein the redistribution layer includes a plurality of circuit layers, a topmost circuit layer of the redistribution layer has a top surface and includes at least one upper dimple recessed from the top surface, and the upper conductive via extends into the upper dimple.

2. The wiring structure of claim 1, wherein a line space of the circuit layer of the redistribution layer is less than a line space of the circuit layer of the upper conductive structure and a line space of the circuit layer of the lower conductive structure.

3. The wiring structure of claim 2, wherein the line width/line space of the circuit layer of the redistribution layer is less than about 10 μm/10 μm, and the line width/line space of the circuit layer of the upper conductive structure and the line width/line space of the circuit layer of the lower conductive structure are greater than or equal to about 10 μm/10 μm.

4. The wiring structure of claim 1, wherein a surface roughness of a boundary between the redistribution structure and the upper conductive structure is greater than a surface roughness of a boundary between two adjacent dielectric layers of the dielectric structure, and a surface roughness of a boundary between the redistribution structure and the lower conductive structure is greater than a surface roughness of a boundary between two adjacent dielectric layers of the dielectric structure.

5. The wiring structure of claim 1, wherein a material of the dielectric layer of the upper conductive structure is different from a material of the dielectric structure of the redistribution structure.

6. The wiring structure of claim 1, wherein the redistribution layer includes a plurality of circuit layers, and the upper conductive via is electrically connected to a topmost circuit layer of the redistribution layer.

7. The wiring structure of claim 1, wherein the at least one upper conductive via includes a plurality of upper conductive vias, and at least three traces of the circuit layer of the redistribution layer are disposed between two adjacent upper conductive vias.

8. The wiring structure of claim 1, wherein the upper conductive via tapers downward.

9. The wiring structure of claim 1, wherein the upper conductive structure further includes at least one inner via electrically connected to the circuit layer of the upper conductive structure, the lower conductive structure further includes at least one inner via electrically connected to the circuit layer of the lower conductive structure, and the inner via of the upper conductive structure and the inner via of the lower conductive structure are symmetric structure.

10. The wiring structure of claim 1, wherein the upper conductive structure further includes at least one inner via electrically connected to the circuit layer of the upper conductive structure 10, the lower conductive structure further includes at least one inner via electrically connected to the circuit layer of the lower conductive structure, and a tapering direction of the inner via of the upper conductive structure is contrary to a tapering direction of the inner via of the lower conductive structure.

11. The wiring structure of claim 1, wherein a metal content of the upper conductive structure is substantially equal to a metal content of the lower conductive structure.

12. The wiring structure of claim 1, wherein the dielectric structure of the redistribution structure includes at least one dielectric layer, and the circuit layer of the redistribution layer covers more than 60% of a top surface of the dielectric layer of the dielectric structure.

13. The wiring structure of claim 1, further comprising at least one lower conductive via extending through the dielectric layer of the lower conductive structure and a portion of the dielectric structure of the redistribution structure and electrically connected to the redistribution layer of the redistribution structure and the circuit layer of the lower conductive structure.

14. A wiring structure, comprising:

an upper conductive structure including at least one dielectric layer and at least one circuit layer in contact with the dielectric layer;

a lower conductive structure including at least one dielectric layer and at least one circuit layer in contact with the dielectric layer;

a redistribution structure disposed between the upper conductive structure and the lower conductive structure to electrically connect the upper conductive structure and the lower conductive structure, wherein the redistribution structure includes a dielectric structure and a redistribution layer embedded in the dielectric structure, the redistribution layer includes a topmost circuit layer, a bottommost circuit layer and at least one intermediate circuit layer between the topmost circuit layer and the bottommost circuit layer, and a thickness of the intermediate circuit layer is less than a thickness of the topmost circuit layer and a thickness of the bottommost circuit layer; and at least one upper conductive via extending through the dielectric layer of the upper conductive structure and a portion of the dielectric structure of the redistribution structure and electrically connected to the topmost circuit layer of the redistribution layer and the circuit layer of the upper conductive structure, wherein the topmost circuit layer has a top surface and includes at least one upper dimple recessed from the top surface, and the upper conductive via extends into the upper dimple.

15. The wiring structure of claim 14, wherein the thickness of the bottommost circuit layer is substantially equal to the thickness of the topmost circuit layer.

16. The wiring structure of claim 14, wherein a surface roughness of a boundary between the redistribution structure and the upper conductive structure is greater than a surface roughness of a boundary between two adjacent dielectric layers of the dielectric structure, and a surface roughness of a boundary between the redistribution structure and the lower conductive structure is greater than a surface roughness of a boundary between two adjacent dielectric layers of the dielectric structure.

17. The wiring structure of claim 14, further comprising a plurality of upper conductive vias extending through the dielectric layer of the upper conductive structure and a portion of the dielectric structure of the redistribution structure and electrically connected to the topmost circuit layer of the redistribution layer and the circuit layer of the upper conductive structure, wherein at least three traces of the topmost circuit layer are disposed between two adjacent upper conductive vias.

18. A wiring structure, comprising:
- an upper conductive structure;
- a redistribution structure disposed at a side of the upper conductive structure, wherein the redistribution structure includes a circuit layer; and
- a conductive element extending through the upper conductive structure and a portion of the redistribution structure, wherein the circuit layer has a surface and includes a dimple recessed from the surface, and the conductive element extends into the dimple.

19. The wiring structure of claim 18, wherein a line width of the circuit layer of the redistribution structure is less than a line width of a circuit layer of the upper conductive structure.

20. The wiring structure of claim 18, wherein a thickness of the circuit layer of the redistribution structure is less than a thickness of a circuit layer of the upper conductive structure.

* * * * *